US012721049B2

(12) United States Patent
Kikuchi et al.

(10) Patent No.: US 12,721,049 B2
(45) Date of Patent: Aug. 25, 2026

(54) QUANTUM DEVICE

(71) Applicant: NEC Corporation, Tokyo (JP)

(72) Inventors: Katsumi Kikuchi, Tokyo (JP); Akira Miyata, Tokyo (JP); Suguru Watanabe, Tokyo (JP); Takanori Nishi, Tokyo (JP); Hideyuki Satou, Tokyo (JP); Kenji Nanba, Tokyo (JP); Ayami Yamaguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 641 days.

(21) Appl. No.: 18/007,772

(22) PCT Filed: Jun. 5, 2020

(86) PCT No.: PCT/JP2020/022435
§ 371 (c)(1),
(2) Date: Dec. 2, 2022

(87) PCT Pub. No.: WO2021/245948
PCT Pub. Date: Dec. 9, 2021

(65) Prior Publication Data

US 2023/0345844 A1 Oct. 26, 2023

(51) Int. Cl.

| | |
|---|---|
| ***H10N 60/81*** | (2023.01) |
| ***G06N 10/40*** | (2022.01) |
| ***H01P 7/08*** | (2006.01) |

(52) U.S. Cl.
CPC ........... *H10N 60/815* (2023.02); *G06N 10/40* (2022.01); *H01P 7/082* (2013.01)

(58) Field of Classification Search
CPC ...... H10N 60/815; H10N 69/00; G06N 10/40; H01P 7/082; H01L 23/3677; H01L 23/147; H01L 23/49888
See application file for complete search history.

(56) References Cited

U.S. PATENT DOCUMENTS 11,972,320 B1 * 4/2024 Wang ..................... H10N 69/00
2005/0280141 A1 12/2005 Zhang
(Continued)

FOREIGN PATENT DOCUMENTS

JP H01-258457 A 10/1989
JP H04-338683 A 11/1992
(Continued)

OTHER PUBLICATIONS

International Search Report for PCT Application No. PCT/JP2020/022435, mailed on Aug. 18, 2020.
(Continued)

*Primary Examiner* — Moazzam Hossain
(74) *Attorney, Agent, or Firm* — Sughrue Mion, PLLC.

(57) ABSTRACT

Provided is a quantum device capable of improving cooling performance. A quantum device includes a quantum chip configured to perform information processing using a quantum state, and an interposer on which the quantum chip is mounted, and the quantum chip is arranged inside a recess 31 formed in a sample stage having a cooling function, and a part of the interposer is in contact with the sample stage. The quantum chip may have a first surface mounted on the interposer and a second surface opposite to the first surface, and at least a part of the second surface may be in contact with an inner surface of the recess.

21 Claims, 11 Drawing Sheets

(56) References Cited

U.S. PATENT DOCUMENTS

| | | | | |
|---|---|---|---|---|
| 2006/0091542 | A1 | 5/2006 | Zhao et al. | |
| 2019/0044047 | A1 | 2/2019 | Elsherbini et al. | |
| 2020/0364600 | A1* | 11/2020 | Elsherbini | G06N 10/40 |
| 2021/0167271 | A1 | 6/2021 | Hidaka et al. | |

FOREIGN PATENT DOCUMENTS

| | | | |
|---|---|---|---|
| JP | 2000-114608 | A | 4/2000 |
| JP | 2016-040799 | A | 3/2016 |
| WO | 2018/212041 | A1 | 11/2018 |

OTHER PUBLICATIONS

JP Office Action for JP Application No. 2023-088644, mailed on Jun. 25, 2024 with English Translation.

* cited by examiner

Fig. 7
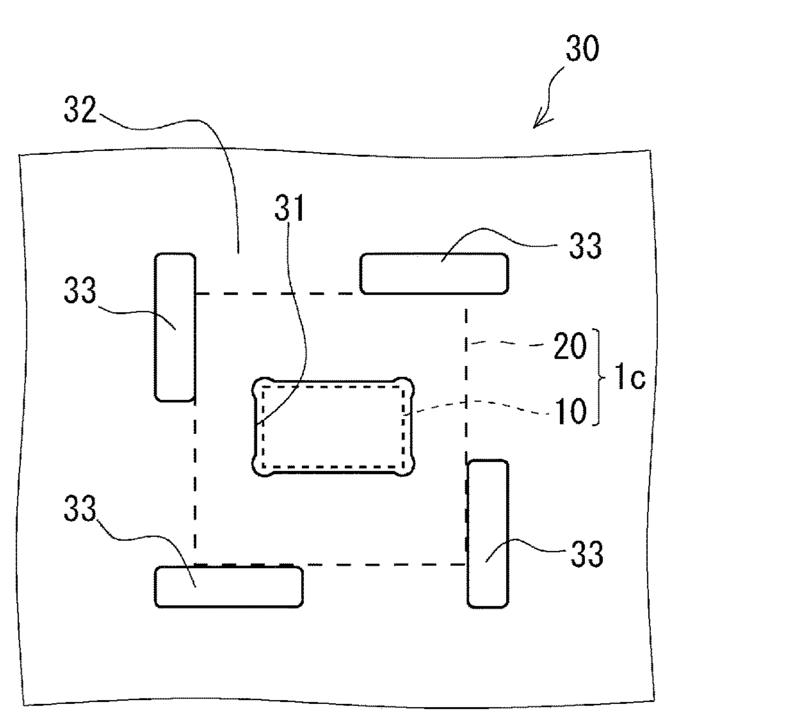
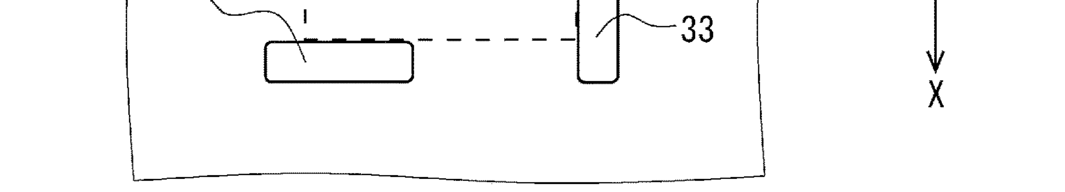
Fig. 8
1d
20
11
34
22
24
31
32
25
23
27
21
10
16
30
BP
15
12
22
24
27
25
23
21
22
24
27
28
25
23
21
Z
X
Y

QUANTUM DEVICE

This application is a National Stage Entry of PCT/JP2020/022435 filed on Jun. 5, 2020, the contents of all of which are incorporated herein by reference, in their entirety.

TECHNICAL FIELD

The present invention relates to a quantum device.

BACKGROUND ART

Patent Literature 1 describes a quantum device in which a quantum chip using a quantum state is flip-chip mounted on an interposer. In order to use such a quantum device in a superconducting state, it is conceivable to fix a surface of an interposer on which a quantum chip is not mounted on a sample stage having a cooling function. In this case, the quantum chip is cooled from the sample stage through the interposer and kept at a predetermined temperature.

CITATION LIST

Patent Literature

Patent Literature 1: International Patent Publication No. WO2018/212041

SUMMARY OF INVENTION

Technical Problem

In the quantum device described above, since one surface of the interposer is used for cooling by the sample stage, the number of terminals that can be drawn out is limited. Meanwhile, since performance cannot be obtained unless the quantum chip is cooled to a predetermined temperature, it is necessary to achieve both the increase in the number of terminals while cooling.

An object of the present disclosure is to solve such a problem, and to provide a quantum device capable of improving a cooling function while securing the number of terminals.

Solution to Problem

According to an aspect of the present disclosure, there is provided a quantum device including: a quantum chip configured to perform information processing using a quantum state; and an interposer on which the quantum chip is mounted, in which the quantum chip is arranged inside a recess formed in a sample stage having a cooling function, and a part of the interposer is in contact with the sample stage.

Advantageous Effects of Invention

According to the present disclosure, it is possible to provide a quantum device capable of improving a cooling effect while securing the number of terminals.

BRIEF DESCRIPTION OF DRAWINGS

FIG. 7 is a plan view illustrating the recess and the pressing member of the sample stage according to the third modification of the first example embodiment.

FIG. 8 is a cross-sectional view illustrating a cooling member and a thermal via according to a fourth modification of the first example embodiment.

EXAMPLE EMBODIMENT

Figure 1:
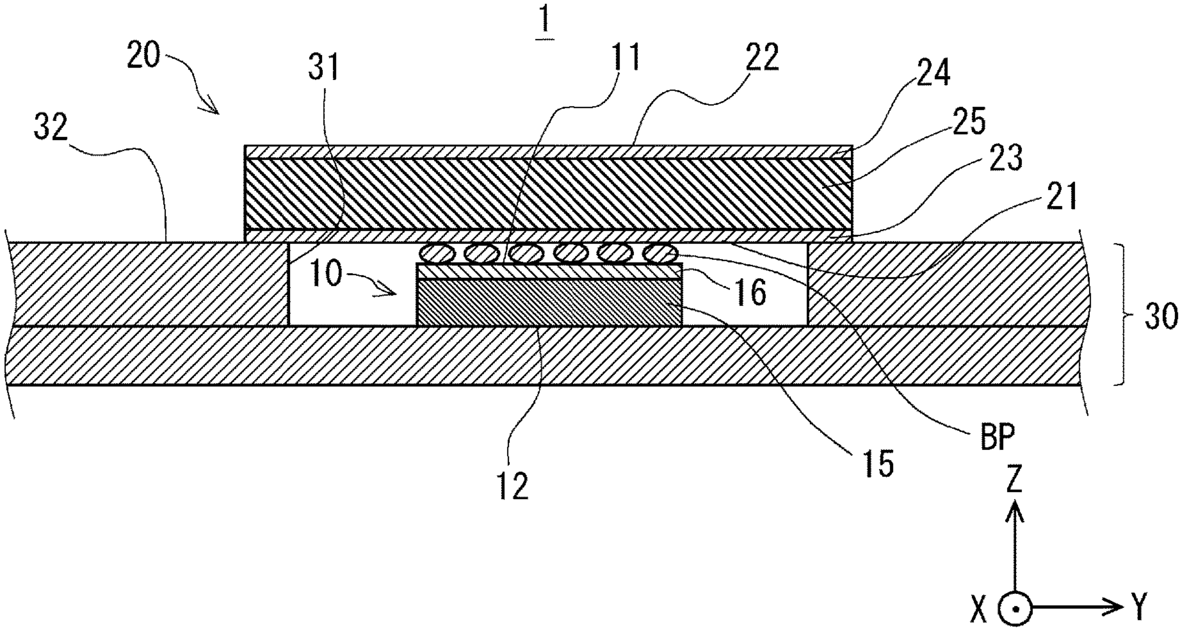
FIG. 1 is a cross-sectional view illustrating a quantum device according to a first example embodiment.

For clarity of description, in the following description and figures, omission and simplification are made as appropriate. In the figures, the same elements are denoted by the same reference numerals, and redundant description is omitted as necessary.

First Example Embodiment

Figure 2:
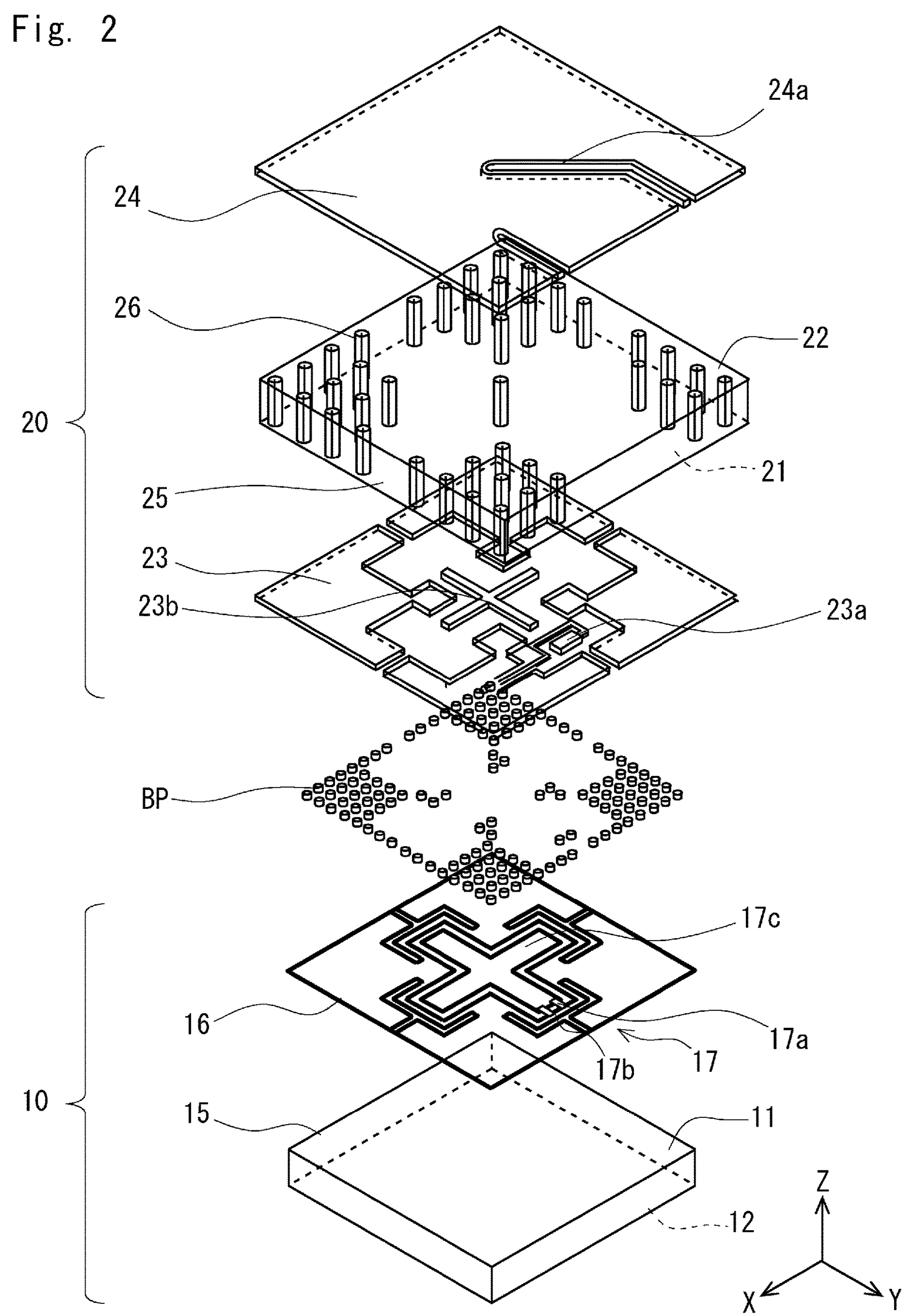
FIG. 2 is an exploded perspective view illustrating the quantum device according to the first example embodiment.

A quantum device according to a first example embodiment will be described. FIG. 1 is a cross-sectional view illustrating a quantum device according to the first example embodiment. FIG. 2 is an exploded perspective view illustrating the quantum device according to the first example embodiment. As illustrated in FIGS. 1 and 2, a quantum device 1 includes a quantum chip 10 and an interposer 20.

The quantum chip 10 includes a chip substrate 15 and a wiring layer 16. The chip substrate 15 contains, for example, silicon (Si). Note that the chip substrate 15 is not limited to one containing silicon as long as the quantum chip 10 can perform information processing using a quantum state, and may contain another electronic material such as sapphire or a compound semiconductor material (Group IV, III-V, II-VI). In addition, a single crystal is desirable, but a polycrystalline or amorphous crystal may be used.

The shape of the chip substrate 15 is, for example, a plate shape, and has one plate surface and the other plate surface opposite to the one plate surface. One plate surface is referred to as a first surface 11, and the other plate surface is referred to as a second surface 12. Therefore, the quantum chip 10 and the chip substrate 15 have the first surface 11 and the second surface 12. For example, the first surface 11 and the second surface 12 are rectangular. In the quantum device 1, the first surface 11 faces the interposer 20 side. The first surface 11 is mounted on the interposer 20 by bumps BP.

The wiring layer 16 is provided on the first surface 11 side of the chip substrate 15. The wiring layer 16 contains, for example, a superconducting material such as niobium (Nb). The superconducting material used for the wiring layer 16 is not limited to, for example, niobium (Nb), and may be niobium nitride, aluminum (Al), indium (In), lead (Pb), tin (Sn), rhenium (Re), palladium (Pd), titanium (Ti), or an alloy containing at least one of these.

The wiring layer 16 includes a quantum circuit 17. In the quantum circuit 17, a resonator 17*c* having a loop circuit 17*b* in which a superconducting material is annularly connected by a Josephson junction 17*a* is formed. The material used for the Josephson junction is preferably Al, but may be another superconducting material. The quantum circuit 17 performs information processing using the resonator 17*c* in a quantum state in superconducting. As described above, the quantum chip 10 includes the quantum circuit 17 and performs information processing using a quantum state.

The wiring layer 16 is mounted on the interposer 20 through the bumps BP. Therefore, the quantum chip 10 is flip-chip mounted on the interposer 20.

The bumps BP may contain the above-described superconducting material. The bumps BP may contain the same superconducting material as that of the wiring layer 16 or may contain a superconducting material different from that of the wiring layer 16. When the bumps BP include a plurality of metal layers, at least one layer preferably contains a superconducting material. The bumps BP may be layers including Nb(the wiring surface of the quantum chip 10)/In(Sn, Pb, and alloy including at least any of these)/Ti/Nb(the wiring surface of the interposer 20)/Cu, layers including Nb(the wiring surface of the quantum chip 10)/Nb(the wiring surface of the interposer 20)/Cu, or layers including Nb(the wiring surface of the quantum chip 10)/In(Sn, Pb, and alloy including at least any of these)/Ta(the wiring surface of the interposer 20)/Cu. In the case of the bumps BP including Al and In, TiN may be used for a barrier layer in order to prevent alloying between Al and In. In this case, the bumps BP may be layers including Al(the wiring surface of the quantum chip 10)/Ti/TiN/In(Sn, Pb, and alloy containing at least any of these)/TiN/Ti/Al (the wiring surface of the interposer 20)/Cu. Here, Ti is an adhesion layer. A preferred flip-chip connection is Nb (wiring of quantum chip 10)/In/Ti/Nb(the wiring surface of the interposer 20)/Cu, or Nb(the wiring of the quantum chip 10)/Nb (the wiring surface of the interposer 20)/Cu. It is preferable to add a thickness of Cu in a range of 2 to 10 [μm] to a thickness of 2 [μm] of an interposer wiring layer 23 to provide a bump of φ100 [μm].

The interposer 20 includes interposer wiring layers 23 and 24, an interposer substrate 25, and a through vias (hereinafter referred to as TVs 26). Note that, in FIG. 1, the TVs 26 are omitted so as not to complicate the figure.

The interposer substrate 25 has, for example, a plate shape. The interposer substrate 25 contains, for example, silicon (Si). Note that the interposer substrate 25 is not limited to one containing silicon as long as the quantum chip 10 can be mounted, and may contain other electronic materials such as sapphire, a compound semiconductor material (Group IV, III-V, II-VI), glass, and ceramics. The surface of the interposer substrate 25 is preferably covered with a silicon oxide film ($SiO_2$, TEOS film, or the like). The interposer substrate 25 and the interposer 20 have a mounting surface 21 on which the quantum chip 10 is mounted and an opposite surface 22 opposite to the mounting surface 21.

Here, XYZ orthogonal coordinate axes are introduced for convenience of description of the quantum device 1. A plane parallel to the opposite surface 22 of the interposer 20 is defined as an XY plane, and a direction orthogonal to the opposite surface 22 is defined as a Z-axis direction. A +Z-axis direction is defined as upward, and a −Z-axis direction is defined as downward. Note that the upper side and the lower side are for convenience of description, and do not indicate the direction in which the quantum device 1 is arranged when the quantum device 1 is actually used.

For example, the quantum chip 10 is arranged on the −Z-axis direction side of the interposer 20. The wiring layer 16 arranged on the +X-axis direction side of the quantum chip 10 and the mounting surface 21 arranged on the −Z-axis direction side of the interposer 20 are connected through the bumps BP.

The interposer wiring layer 23 is formed on the mounting surface 21 side of the interposer 20, that is, on the −Z-axis direction side of the interposer 20. The interposer wiring layer 23 contains the above-described superconducting material. The interposer wiring layer 23 may contain the same superconducting material as that of the wiring layer 16 or may contain a superconducting material different from that of the wiring layer 16. For example, the interposer wiring layer 23 preferably includes a surface containing Nb (0.1 [μm] thick), Cu (2 [μm] thick) under Nb, and Ti under Cu. For example, when the interposer substrate 25 contains silicon, the mounting surface 21 side of the interposer 20 preferably has a configuration of Nb/Cu/Ti/$SiO_2$/Si (interposer substrate 25). The interposer wiring layer 23 is connected to the wiring layer 16 of the quantum chip 10 through the bumps BP.

The interposer wiring layer 23 may be a single layer or a multilayer. The interposer wiring layer 23 may include a magnetic field application circuit 23*a* and a reading unit 23*b*. The magnetic field application circuit 23*a* generates a magnetic field to be applied to the loop circuit 17*b*. By applying a magnetic field to the loop circuit 17*b*, the quantum circuit 17 can function as a transmitter. The reading unit 23*b* reads information from the quantum circuit 17.

The interposer wiring layer 24 is formed on the opposite surface 22 side of the interposer substrate 25, that is, on the +Z-axis direction side of the interposer 20. The interposer wiring layer 24 may contain the superconducting material described above. The interposer wiring layer 24 may contain the same superconducting material as that of the wiring layer 16 and the interposer wiring layer 23, or may contain a superconducting material different from those of the wiring layer 16 and the interposer wiring layer 23. The interposer wiring layer 24 may contain a normal conductive material. The normal conductive material is, for example, copper (Cu), silver (Ag), gold (Au), platinum (Pt), or an alloy containing at least one of these. For example, the interposer wiring layer 24 preferably contains a surface containing Cu and Ti below Cu. For example, when the interposer substrate 25 contains silicon, the opposite surface 22 side of the interposer 20 is preferably configured to be Cu/Ti/$SiO_2$/Si (interposer substrate 25).

The interposer wiring layer 24 may be a single layer or a multilayer. The interposer wiring layer 24 includes a terminal 24*a* for extracting information from the quantum chip 10. In the quantum device 1 of the present example embodiment, the opposite surface 22 may not be in contact with a sample stage 30 having a cooling function. As a result, the opposite surface 22 can be used as the terminal 24*a* for extracting information to the maximum.

The TVs 26 penetrate the interposer substrate 25 from the mounting surface 21 side to the opposite surface 22 side. The interposer wiring layer 23 and the interposer wiring layer 24 are connected by the TVs 26.

The TVs 26 may contain the superconducting material described above. The TVs 26 may contain the same superconducting material as that of the wiring layer 16 or the like, or may contain a superconducting material different from that of the wiring layer 16 or the like. In addition, the TVs 26 may contain the above-described normal conductive material. The TVs 26 may contain the same normal conductive material as that of the interposer wiring layer 24, or may contain a normal conductive material different from that of the interposer wiring layer 24. For example, in the TVs 26, $SiO_2$ (for example, a thermal oxide film) is formed as sidewalls of through holes of φ50 [μm], and the through holes are filled Cu with Ti as adhesion layers.

The sample stage 30 has a cooling function. For example, the sample stage 30 is a cold stage that can be cooled to an extreme temperature of about 10 [mK] by a refrigerator. The sample stage 30 preferably contains, for example, a metal such as Cu, a Cu alloy, or Al. In the case of the sample stage 30 containing Al, insulation by alumite treatment may be performed. The quantum device 1 of the present example embodiment uses, for example, a superconducting phenomenon at a cryogenic temperature of 9.2 [K] or less in the case of containing Nb and 1.2 [K] or less in the case of containing Al as the superconducting material of the quantum chip 10. Therefore, the sample stage 30 that can be cooled to such an extreme temperature is used.

A recess 31 is formed in the sample stage 30. For example, the recess 31 is formed on a predetermined surface 32 of the sample stage 30. The predetermined surface 32 is, for example, an upper surface facing the +Z axis direction. The recess 31 is open to the +Z-axis direction side. When viewed from above, the recess 31 is, for example, rectangular.

The quantum chip 10 is smaller than the recess 31 when viewed from above through the interposer 20. Meanwhile, the interposer 20 is larger than the recess 31 when viewed from above. The quantum chip 10 is arranged inside a recess 31 formed in the sample stage 30 having a cooling function. Meanwhile, a part of the interposer 20 is in contact with the sample stage 30. For example, a part of the mounting surface 21 of the interposer 20 on which the quantum chip 10 is mounted is in contact with the upper surface of the sample stage 30.

In the portion of the mounting surface 21 of the interposer 20 in contact with the sample stage 30, an insulating film may be formed or an insulating spacer may be arranged in order to prevent electrical conduction with the sample stage 30. The interposer wiring layer 23 may not be formed on the portion of the mounting surface 21 in contact with the sample stage 30.

By bringing at least a part of the interposer 20 into contact with the sample stage 30, the quantum circuit 17 in the quantum chip 10 can be cooled to a cryogenic temperature by using the interposer 20 as a heat flow path, and a superconducting phenomenon can be utilized. In addition, when the second surface 12 of the quantum chip 10 is brought into contact with the inner surface of the recess 31, the cooling performance can be further improved. In order to improve the heat insulating property for reducing the temperature change around the quantum chip, it is preferable to bring the periphery of the quantum chip 10 into a vacuum state or a reduced pressure atmosphere.

Figure 3:
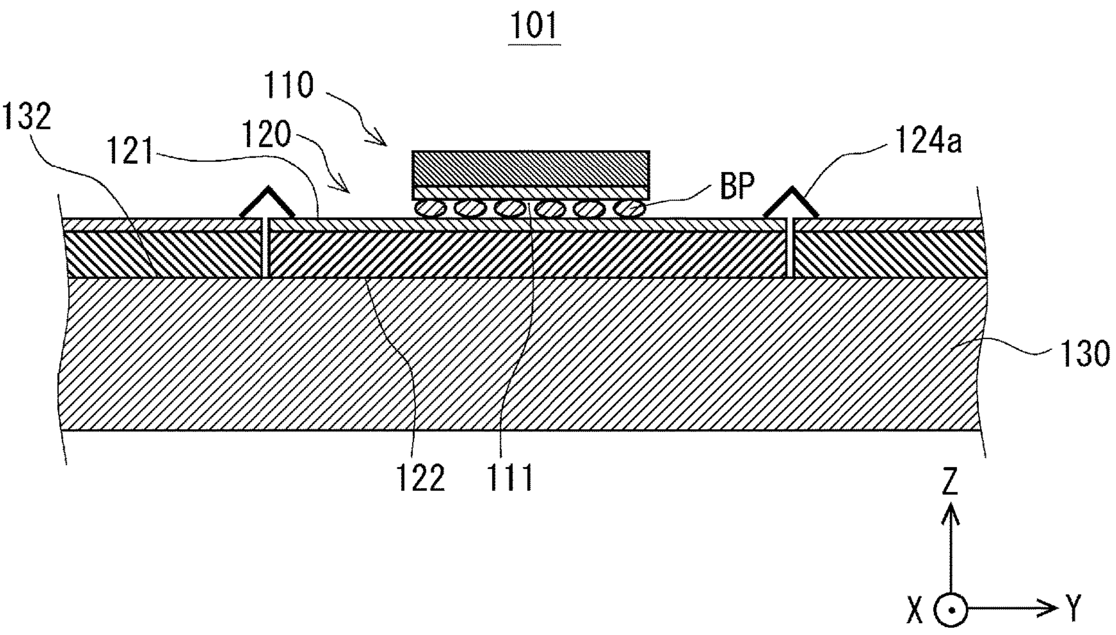
FIG. 3 is a cross-sectional view illustrating a quantum device according to a comparative example.

Next, a comparative example will be described. Thereafter, the effect of the quantum device 1 of the present example embodiment will be described by comparing with the comparative example. FIG. 3 is a cross-sectional view illustrating a quantum device according to the comparative example. As illustrated in FIG. 3, a quantum device 101 of the comparative example includes a quantum chip 110 and an interposer 120. A first surface 111 of the quantum chip 110 is mounted on a mounting surface 121 of the interposer 120 through bumps BP. A predetermined surface 132 of a sample stage 130 is in contact with an opposite surface 122 of the interposer 120.

In the quantum device 101 of the comparative example, the quantum chip 110 is cooled from the sample stage 130 having a cooling function through the interposer 120. The upper side of the quantum chip 110 is not surrounded by the sample stage 130 having a cooling function. Therefore, the cooling performance for cooling the quantum chip 110 cannot be improved from a certain level. Since the opposite surface 122 of the interposer 120 is in contact with the sample stage 130, a terminal 124*a* needs to be formed on the mounting surface 121, and the terminal 124*a* cannot be formed on the opposite surface 122. Therefore, there is a limit to the number of the terminals 124*a* that can be drawn out.

In contrast to the comparative example, in the quantum device 1 of the present example embodiment, the quantum chip 10 is arranged inside the sample stage 30 having a cooling function. The second surface 12 of the quantum chip 10 is in contact with the inner surface of the recess 31 of the sample stage 30. At least a part of the second surface 12 may be in contact with the inner surface of the recess 31. With such a configuration, the quantum chip 10 can be cooled from the second surface 12 side by thermal conduction of the sample stage 30, and cooling performance can be improved. Therefore, the quantum circuit 17 in the quantum chip 10 can be stably operated.

In addition, since the second surface 12 is movably in contact with the inner surface of the recess 31, it is possible to suppress stress and strain due to a difference in shrinkage between the quantum chip 10 and the sample stage 30 caused by a temperature change to a cryogenic temperature.

Since at least a part of the interposer 20 is in contact with the sample stage 30, the quantum chip 10 can be cooled by thermal conduction of the sample stage 30 through the interposer 20, and cooling performance can be improved.

The opposite surface 22 of the interposer 20 can be maximally used for the terminal 24*a* for retrieving information from the quantum chip 10. Therefore, the number of information retrieval terminals can be increased.

First Modification

Figure 4:
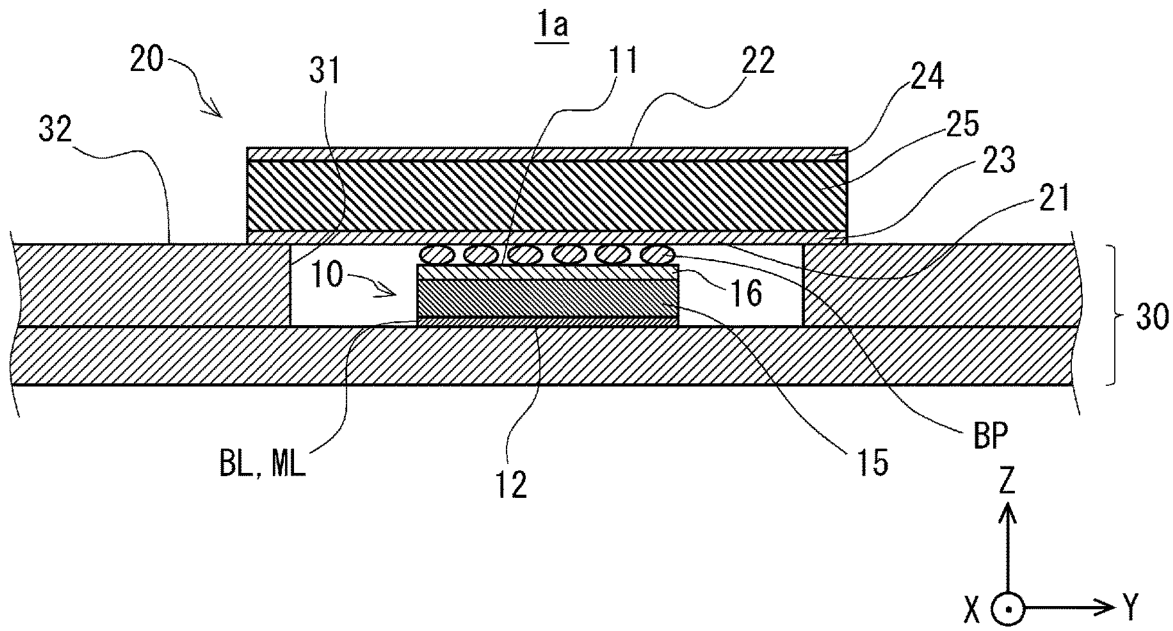
FIG. 4 is a cross-sectional view illustrating a bonding layer or a junction layer according to a first modification of the first example embodiment.

Next, a first modification of the first example embodiment will be described. In the present modification, a bonding layer or a junction layer is provided between the quantum chip 10 and the inner surface of the recess 31. FIG. 4 is a cross-sectional view illustrating the bonding layer or the junction layer according to the first modification of the first example embodiment. As illustrated in FIG. 4, in a quantum device 1*a* of the first modification, at least a part of the second surface 12 of the quantum chip 10 may be bonded or joined to the inner surface of the recess 31. For example, the second surface 12 may be bonded to the sample stage 30 by a bonding layer BL such as varnish or grease. In addition, the second surface 12 may be bonded by a junction layer ML such as a metal layer formed between the chip substrate 15 and the sample stage 30. With such a configuration, installation stability of the quantum chip 10 can be improved, and positional accuracy can be improved. In addition, the thermal connection with the sample stage 30 can be improved.

The bonding layer BL or the junction layer ML may be arranged on the entire second surface 12, or may be arranged on at least a part of the second surface 12, such as a peripheral portion of the second surface 12 or a central portion of the second surface 12. For example, when viewed from above, the bonding layer BL or the junction layer ML may be formed so as to avoid the region where the quantum circuit 17 is formed. When the bonding layer BL is made of an insulating material, the bonding layer BL resonates with the quantum circuit 17 as a capacitor, and there is a possibility that overall energy is lost. By arranging the bonding layer BL so as to avoid the region where the quantum circuit 17 is formed, the resonance can be suppressed.

In addition, in a case where the junction layer ML has conductivity like a metal layer, the ground potential of the quantum chip 10 may be acquired from the sample stage 30 through the junction layer ML, or the potential defined by the sample stage 30 may be acquired.

Second Modification

Figure 5:
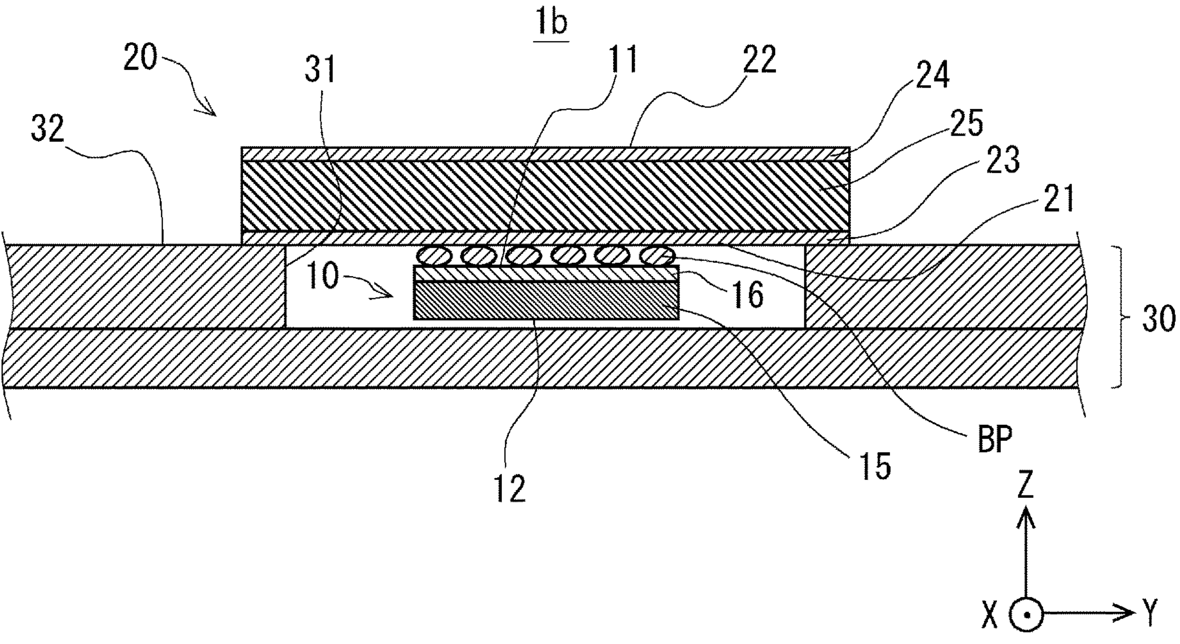
FIG. 5 is a cross-sectional view illustrating a space between a quantum chip and an inner surface of a recess according to a second modification of the first example embodiment.

Next, a second modification of the first example embodiment will be described. In the present modification, a space is provided between the quantum chip 10 and the inner surface of the recess 31. FIG. 5 is a cross-sectional view illustrating a space between the quantum chip 10 and the inner surface of the recess 31 according to the second modification of the first example embodiment. As illustrated in FIG. 5, in a quantum device 1*b* of the second modification, the quantum chip 10 may not be in contact with the sample stage 30. That is, the second surface 12 of the quantum chip 10 may be arranged via the space interposed between the second surface 12 and the inner surface of the recess 31 of the sample stage 30. With such a configuration, it is possible to suppress stress and strain due to the difference in shrinkage between the quantum chip 10 and the sample stage 30 caused by a temperature change to a cryogenic temperature.

Third Modification

Figure 6:
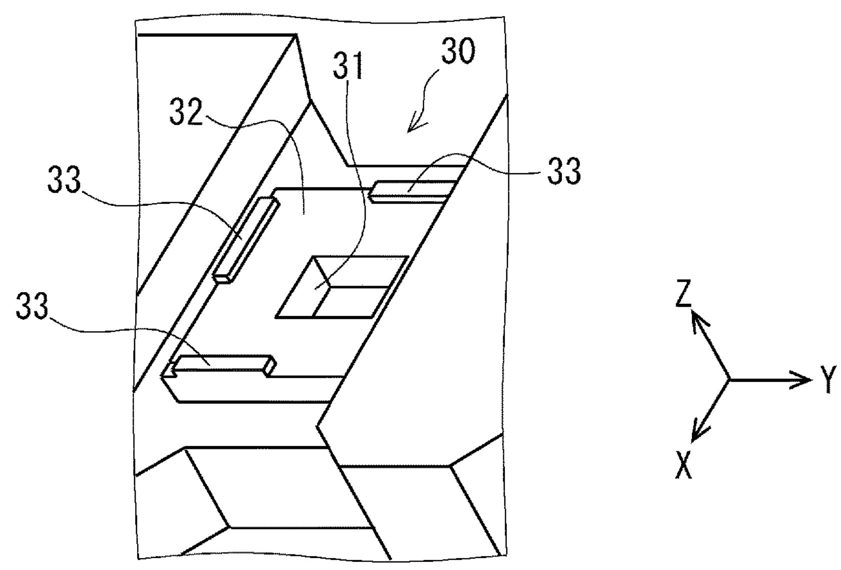
FIG. 6 is a perspective view illustrating a recess and a pressing member of a sample stage according to a third modification of the first example embodiment.

Next, a third modification of the first example embodiment will be described. In the present modification, a pressing member is provided on the predetermined surface 32 of the sample stage 30. FIG. 6 is a perspective view illustrating the recess 31 and the pressing member of the sample stage 30 according to the third modification of the first example embodiment. FIG. 7 is a plan view illustrating the recess 31 and the pressing member of the sample stage 30 according to the third modification of the first example embodiment. As illustrated in FIGS. 6 and 7, in a quantum device 1*c* of the second modification, the recess 31 is formed on the predetermined surface 32 of the sample stage 30, for example, the upper surface of the sample stage 30. A plurality of pressing members 33 is provided on the predetermined surface 32 around the recess 31. For example, the four pressing members 33 are provided on the predetermined surface 32.

At least a part of the side surface of the interposer 20 is in contact with the pressing member 33 provided on the predetermined surface 32. For example, when the interposer 20 is rectangular as viewed from above, the plurality of pressing members 33 presses side surfaces in the vicinity of the respective corner portions of the interposer 20 with planar portions. With such a configuration, the plurality of pressing members 33 can press the side surfaces of the interposer 20 discontinuously at the diagonal portions and at the planar portions. Therefore, when the interposer 20 or the pressing member 33 contracts at a low temperature, it is possible to slide linearly and equalize the contraction.

Fourth Modification

Next, a fourth modification of the first example embodiment will be described. In the present modification, a cooling member is provided on the opposite surface 22 of the interposer 20, and a thermal via is provided inside the interposer 20. FIG. 8 is a cross-sectional view illustrating the cooling member and the thermal via according to the fourth modification of the first example embodiment. In FIG. 8, the TVs 26 of the interposer 20 are omitted so as not to complicate the figure. As illustrated in FIG. 8, in a quantum device 1*d* of a fourth modification, the opposite surface 22 of the interposer 20 may be in contact with a cooling member 34. The cooling member 34 has a cooling function. For example, the cooling member 34 may have a cooling function by being connected to the sample stage 30. With such a configuration, the opposite surface 22 of the interposer 20 can be cooled by heat conduction of the cooling member 34, and cooling performance can be improved.

The interposer 20 may also include thermal vias 27. The thermal vias 27 may be members extending in a direction orthogonal to the mounting surface 21 of the interposer substrate 25. For example, the thermal vias 27 may penetrate the interposer substrate 25. As described above, the interposer 20 may include the thermal vias 27 penetrating from the mounting surface 21 side to the opposite surface 22 side of the interposer substrate 25. The thermal vias 27 may have, for example, a columnar shape such as a circularly columnar shape or a prismatic shape having a central axis extending in a direction orthogonal to the mounting surface 21. The thermal vias 27 can transfer heat between the mounting surface 21 side and the opposite surface 22 side.

The thermal vias 27 preferably contain a material having high thermal conductivity. The thermal vias 27 may contain the above-described superconducting material. The thermal vias 27 may contain the same superconducting material as that of the wiring layer 16 or the like, or may contain a superconducting material different from that of the wiring layer 16 or the like. In addition, the thermal vias 27 may contain the above-described normal conductive material.

The thermal vias 27 may contain the same normal conductive material as that of the interposer wiring layer 24 and the like, or may contain a normal conductive material different from that of the interposer wiring layer 24 and the like. In addition, the thermal vias 27 may contain a ceramic having high thermal conductivity, such as aluminum nitride.

The thermal vias 27 may be connected to the cooling member 34. With such a configuration, the cooling performance of the quantum device 1*d* can be improved. In the quantum device 1*d*, only the cooling member 34 may be provided without providing the thermal vias 27, or only the thermal vias 27 may be provided without providing the cooling member 34. In addition, both the cooling member 34 and the thermal vias 27 may be provided.

In addition, as illustrated in an extracted and enlarged portion in FIG. 8, the thermal vias 27 may include a portion in which a taper in which a diameter on the opposite surface 22 side is larger than a diameter on the mounting surface 21 side is formed. That is, the thermal vias 27 may include a substantially truncated conical portion whose via cross section increases toward the opposite surface 22 side. By including the tapered shape, a heat capacity can be increased, and a rapid temperature change can be alleviated. Therefore, stability of the thermal vias 27 with respect to the temperature can be improved. In addition, when brought into contact with the cooling member 34, a thermal bonding area with the cooling member 34 increases. Therefore, heat transfer can be more effectively promoted. Note that, at an interface between the thermal vias 27 and the through hole, in a case where the temperature is changed from room temperature to a cryogenic temperature, the bonding force at the interface may be reduced. For example, in a case where a force equal to or more than the bonding force is applied to the interface between the thermal vias 27 and the through hole due to thermal shrinkage, or in a case where a material having a low elastic modulus is used for a wall surface, the elastic modulus becomes high (molecules do not move) at a cryogenic temperature, so that there is a possibility that peeling occurs due to loss of the bonding force. In the case of peeling, it is assumed that the positions of the thermal vias 27 change, but a contact surface at the interface between the thermal vias 27 and the through hole can be maintained even when the upper and lower positions move by including the tapered shape. When the thermal vias 27 move, a convex shape for maintaining contact with the cooling member 34 may be formed in the cooling member 34 in advance so that the contact between the cooling member 34 and the thermal vias 27 is maintained.

Further, as illustrated in another extracted and enlarged portion in FIG. 8, the interposer 20 may include a common connection member 28 connecting the plurality of thermal vias 27. For example, the plurality of thermal vias 27 may be connected by a plate-shaped connection member 28 parallel to the mounting surface 21. The connection member 28 preferably contains a material having high thermal conductivity, and may contain the same material as the thermal vias 27. The plurality of thermal vias 27 connected by the connection member 28 can increase the heat capacity and suppress the temperature change.

In addition, a constant potential may be applied to the plurality of thermal vias 27 connected by the connection member 28. For example, a ground potential may be applied. As a result, the quantum chip 10 or the interposer 20 can take the ground potential from the thermal vias 27. In this case, the thermal vias 27 and the connection member 28 preferably contain high thermal conductivity and contain a conductive material.

In the interposer 20, the region where the wiring or the signal line connected to the quantum circuit 17 is mounted generates heat more than the other region. Therefore, it is preferable to make the density of the thermal vias 27 in such a region larger than the density of the other regions. For example, when the interposer substrate 25 is viewed from above, in a case where the quantum chip 10 is mounted at the center of the interposer 20, the density of the thermal vias 27 in the central region is made larger than the density of the thermal vias 27 in the peripheral region. In addition, in the interposer 20, the density of the thermal vias 27 is preferably made larger than the density of the other regions even in the vicinity of the TVs 26 that transmits the signal from the quantum circuit 17. Accordingly, the cooling performance can be improved.

Fifth Modification

Figure 9:
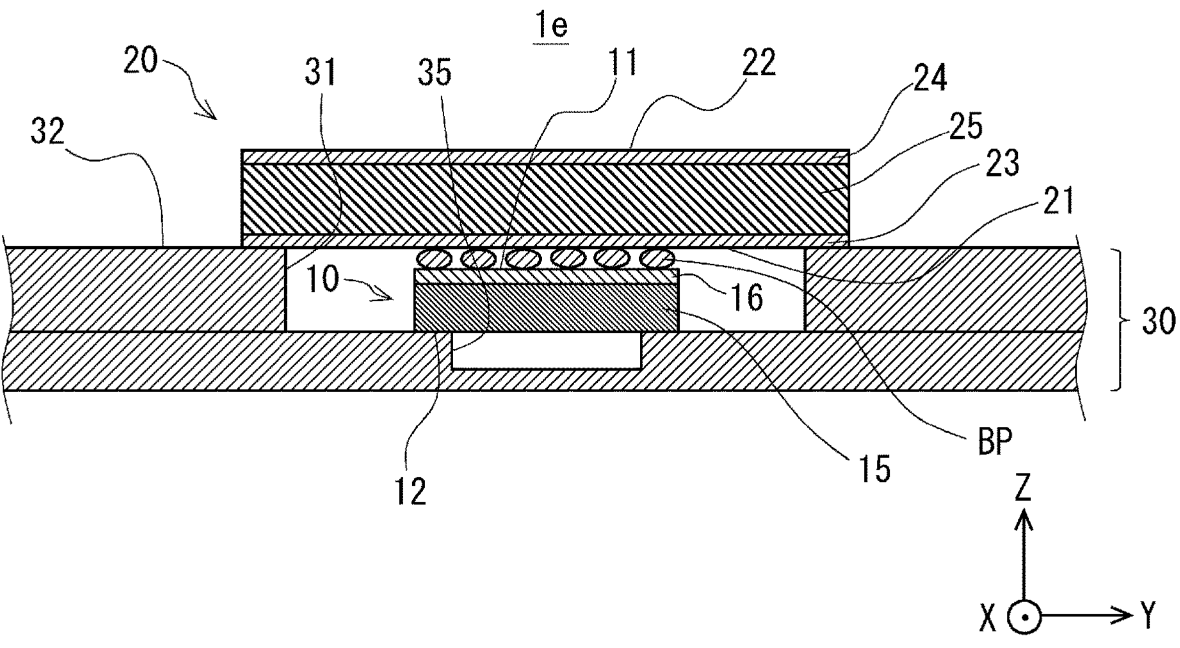
FIG. 9 is a cross-sectional view illustrating a depression formed in a bottom of a recess of a sample stage according to a fifth modification of the first example embodiment.
Figure 10:
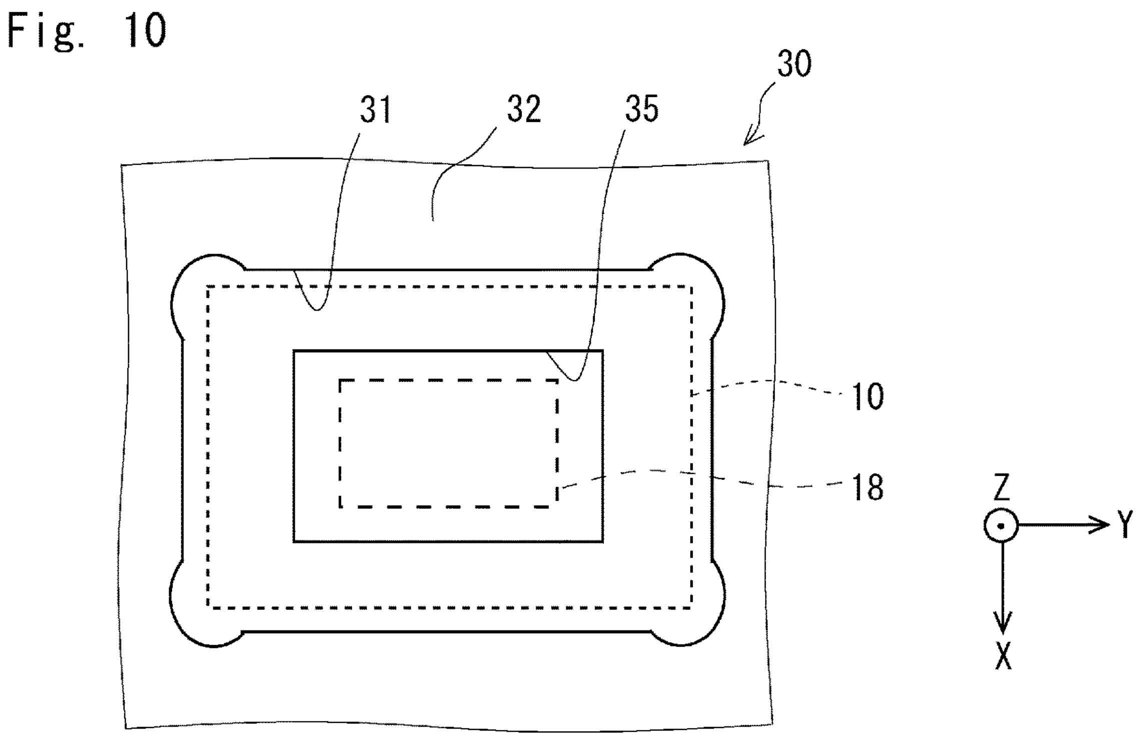
FIG. 10 is a plan view illustrating the depression formed in the bottom of the recess of the sample stage according to the fifth modification of the first example embodiment.

Next, a fifth modification of the first example embodiment will be described. In the present modification, the recess 31 of the sample stage 30 has a depression at the bottom. FIG. 9 is a cross-sectional view illustrating the depression formed in the bottom of the recess 31 of the sample stage 30 according to the fifth modification of the first example embodiment. FIG. 10 is a plan view illustrating the depression formed in the bottom of the recess 31 of the sample stage 30 according to the fifth modification of the first example embodiment. As illustrated in FIGS. 9 and 10, in the quantum device 1*e* of the fifth modification, a depression 35 is formed at the bottom of the recess 31. As illustrated in FIG. 10, when viewed from above, a region of the depression 35 is larger than a region 18 where the quantum circuit 17 is formed. Therefore, the region 18 where the quantum circuit 17 is formed is included in the region of the depression 35. The peripheral portion of the second surface 12 of the quantum chip 10 may be in contact with the bottom of the recess 31. The central portion of the second surface 12 of the quantum chip 10 covers the depression 35.

When viewed from above, the region of the depression 35 may be larger than that of the quantum chip 10. In this case, the second surface 12 of the quantum chip 10 is not in contact with the bottom of the recess 31.

In the quantum device 1*e*, since the region of the depression 35 is larger than the region 18 where the quantum circuit 17 is formed when viewed from above, the distance between the region 18 where the quantum circuit 17 is formed and the sample stage 30 containing metal or the like can be increased. As a result, generation of a pseudo capacitor can be suppressed, and an influence of resonance generated in the main material such as silicon of the chip substrate 15 can be reduced. Therefore, the influence on the operation frequency of the quantum circuit 17 can be reduced.

Sixth Modification

Figure 11:
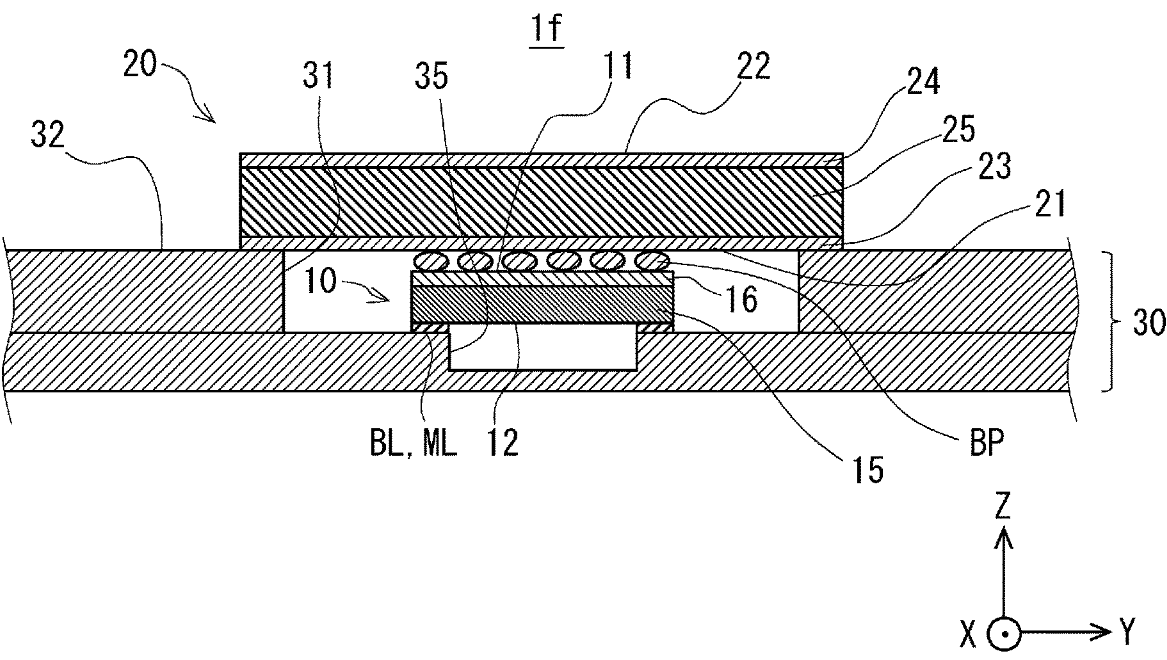
FIG. 11 is a cross-sectional view illustrating a depression formed in a bottom of a recess of a sample stage according to a sixth modification of the first example embodiment.

Next, a sixth modification of the first example embodiment will be described. In the present modification, a peripheral portion of the second surface 12 of the quantum chip 10 is bonded or joined to the periphery of the depression 35. FIG. 11 is a cross-sectional view illustrating a depression formed in a bottom of a recess of a sample stage according to the sixth modification of the first example embodiment. As illustrated in FIG. 11, in a quantum device 1*f* of the sixth modification, the peripheral portion of the second surface 12 of the quantum chip 10 may be bonded to the bottom of the recess 31 by a bonding layer BL, or may be joined by a junction layer ML such as a metal layer. With such a configuration, it is possible to improve installation stability of the quantum chip 10 and improve positional accuracy while reducing the influence of resonance. In addition, the thermal connection with the sample stage 30 can be improved.

Seventh Modification

Figure 12:
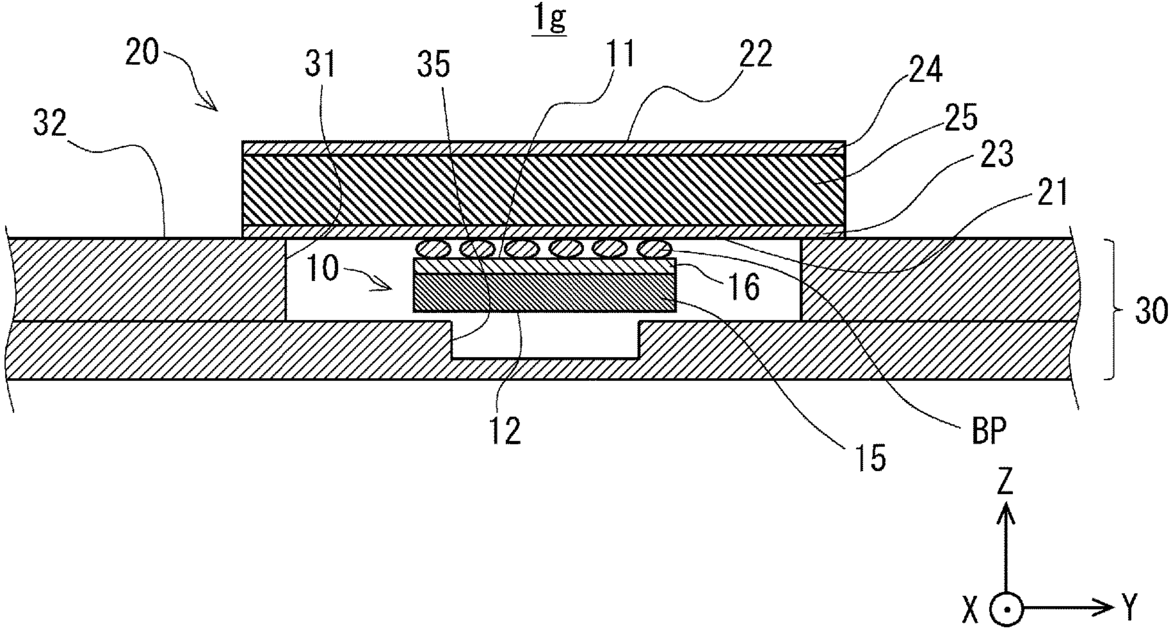
FIG. 12 is a cross-sectional view illustrating a depression formed in a bottom of a recess of a sample stage according to a seventh modification of the first example embodiment.

Next, a seventh modification of the first example embodiment will be described. In the present modification, there is a space between the peripheral portion of the second surface 12 of the quantum chip 10 and the periphery of the depression 35. FIG. 12 is a cross-sectional view illustrating a depression formed in a bottom of a recess of a sample stage according to the seventh modification of the first example embodiment. As illustrated in FIG. 12, in a quantum device 1*g* of the seventh modification, the peripheral portion of the second surface 12 of the quantum chip 10 may not be in contact with the sample stage 30. That is, the peripheral portion of the second surface 12 of the quantum chip 10 may be arranged via a space interposed therebetween with the bottom of the recess 31. With such a configuration, it is possible to suppress stress and strain due to a difference in shrinkage between the quantum chip 10 and the sample stage 30 caused by a temperature change to a cryogenic temperature while reducing the influence of resonance.

Eighth Modification

Figure 13:
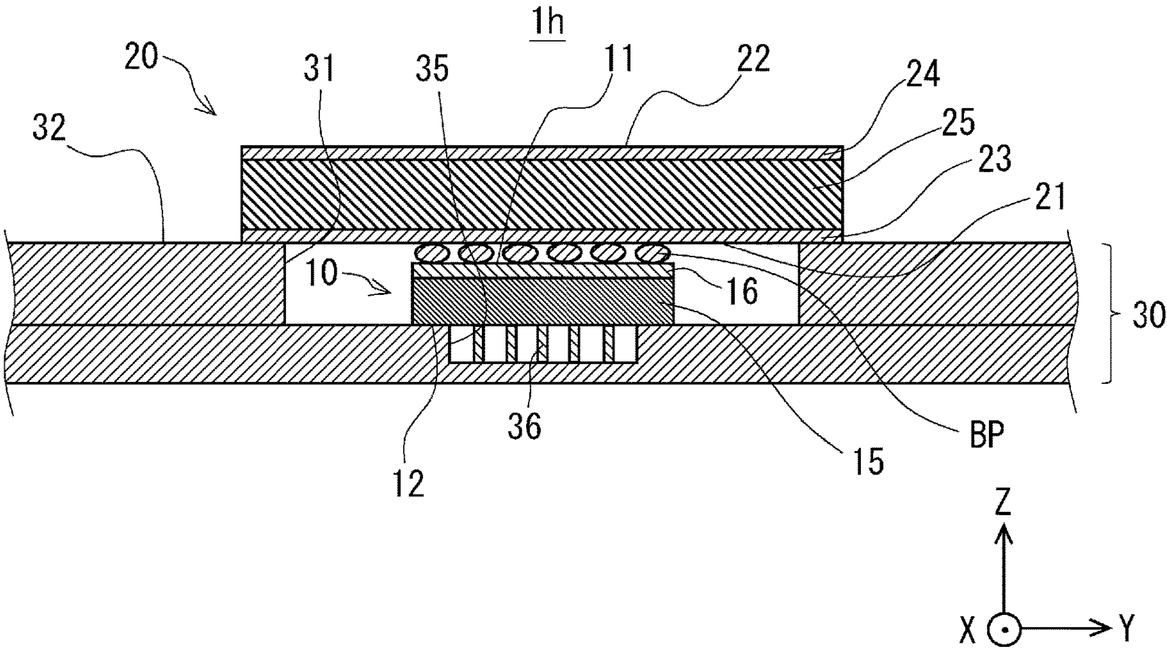
FIG. 13 is a cross-sectional view illustrating a depression and a pillar formed in a bottom of a recess of a sample stage according to an eighth modification of the first example embodiment.

Next, an eighth modification of the first example embodiment will be described. In the present modification, a pillar is provided in the depression 35. FIG. 13 is a cross-sectional view illustrating a depression and a pillar formed in a bottom of a recess of a sample stage according to the eighth modification of the first example embodiment. As illustrated in FIG. 13, in a quantum device 1*h* of the eighth modification, the depression 35 is formed at the bottom of the recess 31. The depression 35 is provided with one or a plurality of pillars 36. The pillar 36 extends in a direction orthogonal to the first surface 11 and the second surface 12. One ends of the pillars 36 are connected to the bottom of the depression 35, and the other ends of the pillars 36 are in contact with the second surface 12 of the quantum chip 10. As described above, the quantum chip 10 is in contact with the pillars 36 extending from the bottom of the depression 35 in the direction orthogonal to the first surface 11. The pillars 36 may be circularly columnar or columnar. The one or more pillars 36 and the second surface 12 may be bonded by a bonding layer BL or may be bonded by a metal layer.

In the quantum device 1*h*, since the region of the depression 35 is larger than the region 18 where the quantum circuit 17 is formed when viewed from above, the distance between the region 18 where the quantum circuit 17 is formed and the sample stage 30 containing metal or the like can be increased. As a result, it is possible to reduce the influence of resonance generated in the main material such as silicon of the chip substrate 15. At the same time, since the pillars 36 are in contact with the second surface 12 of the quantum chip 10, the cooling performance can be improved.

Ninth Modification

Figure 14:
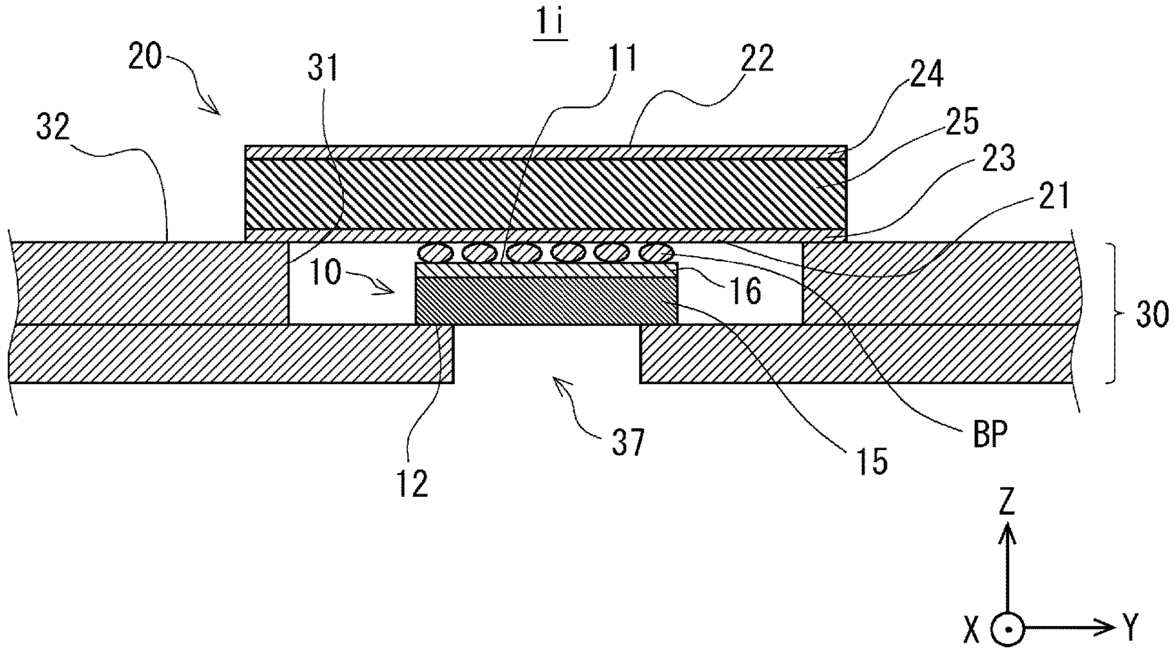
FIG. 14 is a cross-sectional view illustrating a through hole formed in a bottom of a recess of a sample stage according to a ninth modification of the first example embodiment.

Next, a ninth modification of the first example embodiment will be described. In the present modification, a through hole is formed in the bottom of the recess 31 of the sample stage 30. FIG. 14 is a cross-sectional view illustrating the through hole formed in the bottom of the recess 31 of the sample stage 30 according to the ninth modification of the first example embodiment. As illustrated in FIG. 14, in a quantum device 1*i* of the ninth modification, a through hole 37 is formed at the bottom of a recess 31. When viewed from above, the region of the through hole 37 is larger than the region 18 where the quantum circuit 17 is formed. Therefore, the region 18 where the quantum circuit 17 is formed is included in the region of the through hole 37. The peripheral portion of the second surface 12 of the quantum chip 10 may be in contact with the bottom of the recess 31, or may be bonded or joined to the bottom of the recess 31. The central portion of the second surface 12 of the quantum chip 10 covers the through hole 37.

In the quantum device 1*i*, since the region of the through hole 37 is larger than the region 18 where the quantum circuit 17 is formed when viewed from above, the distance between the region 18 where the quantum circuit 17 is formed and the sample stage 30 containing metal or the like can be increased. As a result, it is possible to reduce the influence of resonance generated in the main material such as silicon of the chip substrate 15. Therefore, the influence on the operation frequency of the quantum circuit 17 can be reduced.

Tenth Modification

Figure 15:
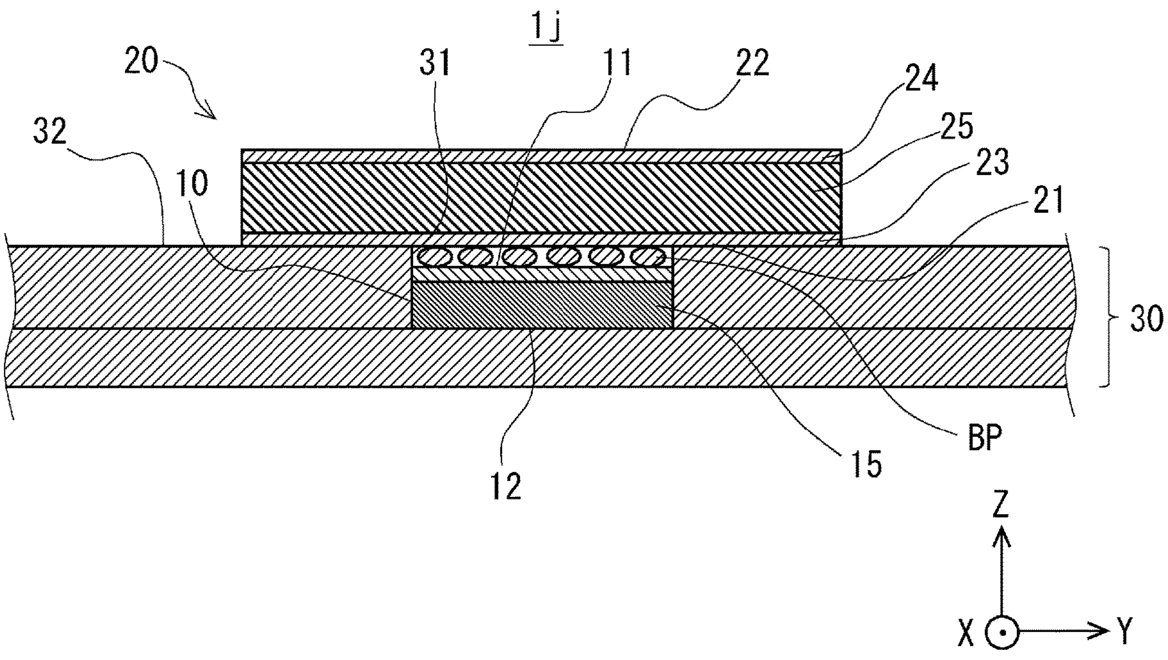
FIG. 15 is a cross-sectional view exemplifying a recess of a sample stage according to a tenth modification of the first example embodiment.

Next, a tenth modification of the first example embodiment will be described. In the present modification, the quantum chip 10 is fitted into the recess 31 at a cryogenic temperature. FIG. 15 is a cross-sectional view illustrating the recess 31 of the sample stage 30 according to the tenth modification of the first example embodiment. As illustrated in FIG. 15, in a quantum device 1*j* of the tenth modification, the quantum chip 10 is fitted into the recess 31 at a cryogenic temperature. Therefore, the side surface of the quantum chip 10 is in contact with the inner surface of the recess 31. As a result, since the quantum chip 10 is cooled by heat conduction from the side surface, cooling performance can be improved.

When the quantum device 1*j* is cooled from a room temperature to a cryogenic temperature of several [mK], the quantum chip 10, the interposer 20, and the sample stage 30 change in volume. Therefore, in consideration of the volume change, the side surface of the quantum chip 10 is brought into contact with the recess 31 at the time of a cryogenic temperature in advance. In addition, the ground potential of the quantum chip 10 may be acquired from the sample stage 30 through the side surface of the quantum chip 10. Some of the first to tenth modifications of the first example embodiment may be appropriately combined.

Second Example Embodiment

Figure 16:
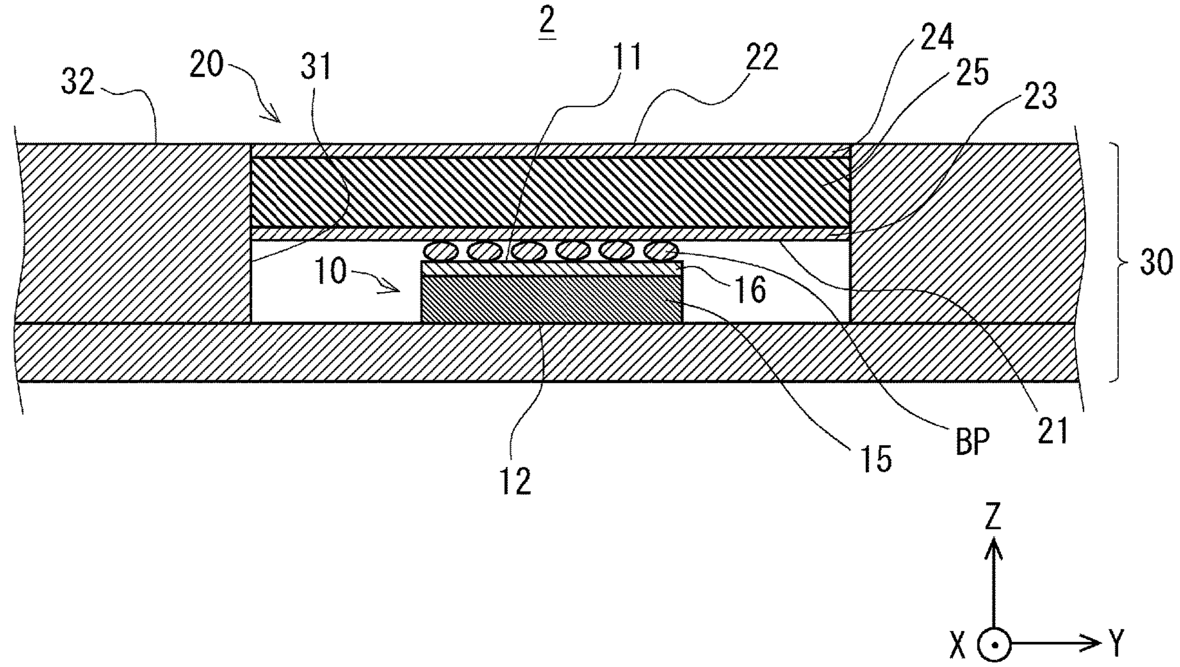
FIG. 16 is a cross-sectional view illustrating a quantum device according to a second example embodiment.

Next, a quantum device according to a second example embodiment will be described. In the quantum device of the present example embodiment, a side surface of an interposer 20 is in contact with an inner surface of a recess 31. FIG. 16 is a cross-sectional view illustrating the quantum device according to the second example embodiment. As illustrated in FIG. 16, a quantum device 2 of the present example embodiment includes a quantum chip 10 and the interposer 20 similarly to the first example embodiment. However, in the quantum device 2, at least a part of the side surface of the interposer 20 is in contact with the inner surface of the recess 31.

With such a configuration, since a mounting surface 21 of the interposer does not have to be in contact with a sample stage 30, the mounting surface 21 can be used to the maximum. For example, an interposer wiring layer 23 can be formed on the mounting surface 21 to the maximum extent. Other configurations and effects are included in the description of the first example embodiment. Some of the first to tenth modifications of the first example embodiment may be combined with the configuration of the second example embodiment.

Third Example Embodiment

Figure 17:
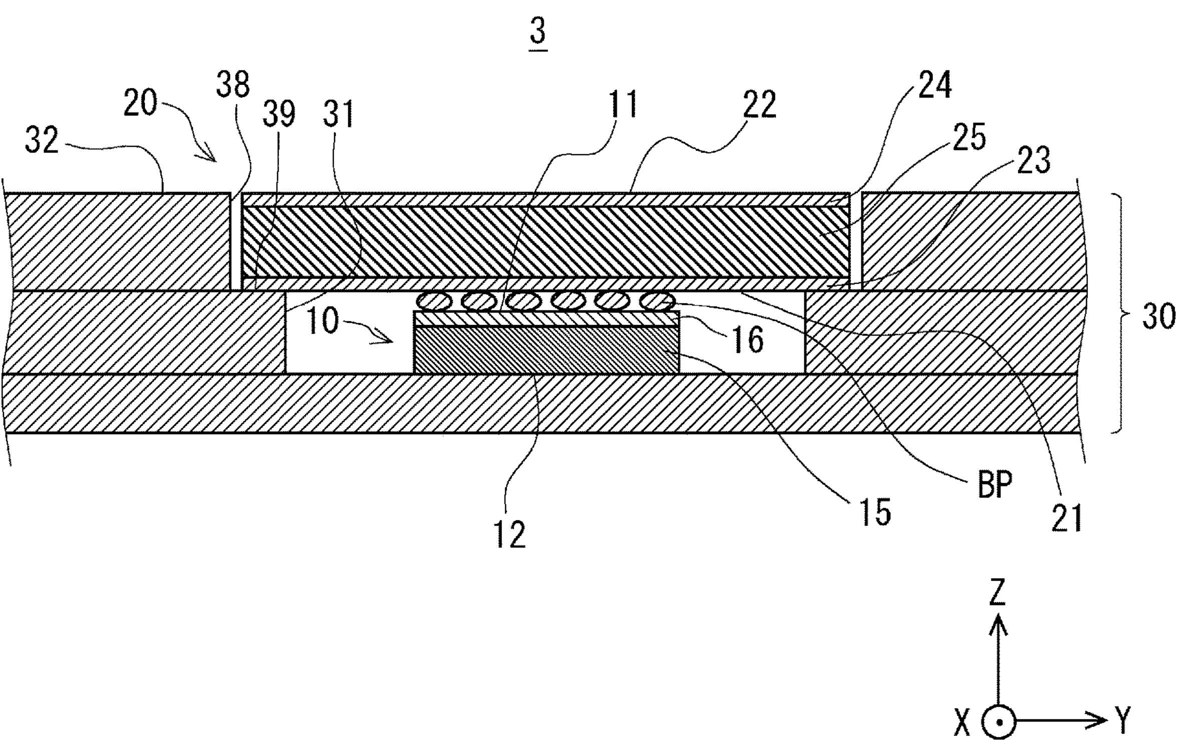
FIG. 17 is a cross-sectional view illustrating a quantum device according to a third example embodiment.
Figure 18:
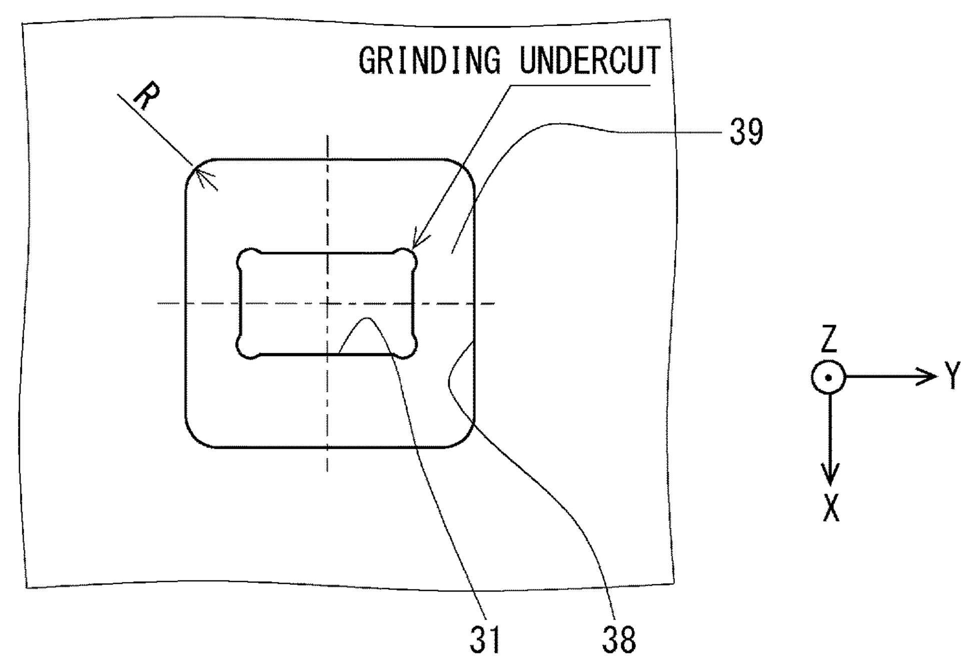
FIG. 18 is a plan view illustrating a recess and a counterbore of a sample stage according to a third example embodiment.

Next, a quantum device according to a third example embodiment will be described. In the quantum device of the present example embodiment, a counterbore is formed in a recess 31. FIG. 17 is a cross-sectional view illustrating the quantum device according to the third example embodiment. FIG. 18 is a plan view illustrating a recess 31 and a counterbore of a sample stage 30 according to the third example embodiment. As illustrated in FIGS. 17 and 18, in a quantum device 3, the recess 31 of the sample stage 30 is formed on a predetermined surface 32 of the sample stage 30. A counterbore 38 is formed around the opening of the recess 31. As a result, a step surface 39 having a step with the predetermined surface 32 is formed around the opening of the recess 31. Therefore, the counterbore 38 includes the step surface 39.

The step surface 39 is, for example, parallel to the predetermined surface 32. The step surface 39 is formed around the recess 31. The step surface 39 surrounds the recess 31. The quantum chip 10 is arranged inside the recess 31. A part of the mounting surface 21 of the interposer 20 is in contact with the step surface 39.

An insulating film may be formed on a portion of the mounting surface 21 of the interposer 20 in contact with the step surface 39 in order to prevent electrical conduction with the step surface 39. The interposer wiring layer 23 may not be formed in the portion of the mounting surface 21 in contact with the step surface 39.

As illustrated in FIG. 18, the recess 31 may have a space on four sides so that the quantum chip 10 can be arranged. In addition, the recess 31 may have a shape in which R or a circle is added to four corners. This makes it possible to suppress the occurrence of stress and strain due to volume change during cooling to a cryogenic temperature. In particular, stress concentration at the four corners due to right-angle and acute-angle shapes can be avoided.

In the quantum device 3 of the present example embodiment, since the interposer 20 is arranged inside the counterbore 38, it is surrounded by the sample stage 30. Therefore, the cooling performance can be improved. Further, since a part of the mounting surface 21 of the interposer 20 is in contact with the step surface 39, cooling performance can also be improved. In addition, since the step between the predetermined surface 32 and the opposite surface 22 can be reduced, the degree of freedom in the arrangement of the quantum device 3 can be improved. Other configurations and effects are included in the description of the first and second example embodiments. Some of the first to tenth modifications of the first example embodiment may be combined with the configuration of third example embodiment.

Fourth Example Embodiment

Figure 19:
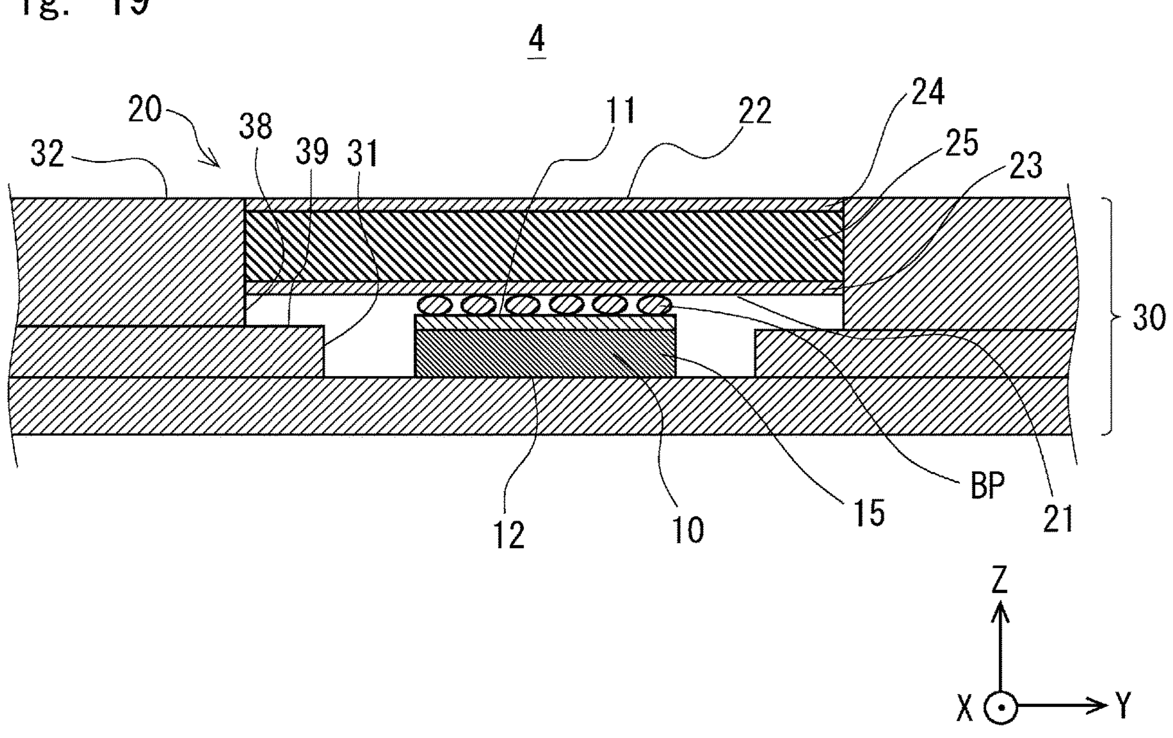
FIG. 19 is a cross-sectional view illustrating a quantum device according to a fourth example embodiment.

Next, a quantum device according to a fourth example embodiment will be described. In the quantum device of the present example embodiment, an interposer 20 is in contact with a side surface of a counterbore 38. FIG. 19 is a cross-sectional view illustrating the quantum device according to the fourth example embodiment. As illustrated in FIG. 19, in a quantum device 4, a recess 31 of a sample stage 30 is formed on a predetermined surface 32 of the sample stage 30. A counterbore 38 is formed around the opening of the recess 31. As a result, a step surface 39 having a step with the predetermined surface 32 is formed around the opening of the recess 31.

In the quantum device 4 of the present example embodiment, at least a part of the side surface of the interposer 20 is in contact with the side surface of the counterbore 38 between a step surface 39 and a predetermined surface 32. A part of a mounting surface 21 of the interposer 20 is arranged via a space interposed between the mounting surface and a step surface 39. Accordingly, since the mounting surface 21 of the interposer 20 does not have to be in contact with the sample stage 30, the mounting surface 21 can be used to the maximum. Other configurations and effects are included in the description of the first to third example embodiments. Some of the first to tenth modifications of the first example embodiment may be combined with the configuration of the fourth example embodiment.

Modification

Figure 20:
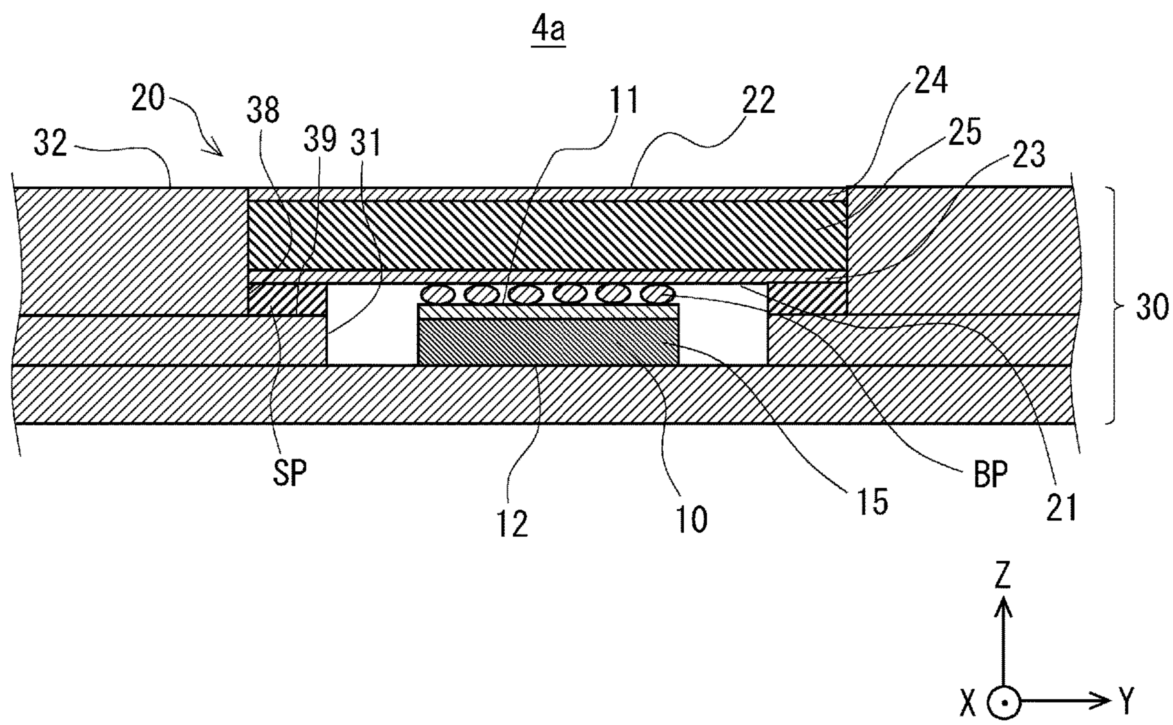
FIG. 20 is a cross-sectional view illustrating a spacer according to a modification of the fourth example embodiment.

Next, a modification of the fourth example embodiment will be described. In the present modification, a spacer is provided between the mounting surface 21 of the interposer 20 and the step surface 39. FIG. 20 is a cross-sectional view illustrating the spacer according to the modification of the fourth example embodiment. As illustrated in FIG. 20, in a quantum device 4*a*, a part of the mounting surface 21 of the interposer 20 is arranged via a spacer SP interposed therebetween with the step surface 39. That is, the spacer SP is arranged between the mounting surface 21 and the step surface 39. The spacer SP preferably contains an insulating material having high thermal conductivity, for example, aluminum nitride, silicon carbide, sapphire, silicon, alumina, or the like.

Since the quantum device 4*a* includes the spacer SP, installation stability of the quantum chip 10 can be improved, and positional accuracy can be improved. In addition, the thermal connection with the sample stage 30 can be improved. Furthermore, by forming the interposer wiring layer 23, the mounting surface 21 can be utilized to the maximum.

Although the invention of the present application has been described above with reference to the example embodiments, the invention of the present application is not limited to the above embodiments, and can be appropriately changed without departing from the gist. For example, a quantum device in which a plurality of the quantum chips 10 is mounted on one interposer 20 is also included in the scope of the technical idea of the present example embodiment. In addition, a configuration in which the configurations of the first to fourth example embodiments and the modifications are assembled is also included in the scope of the technical idea of the present example embodiment.

Some or all of the above example embodiments may be described as the following supplementary notes, but are not limited to the following.

(Supplementary Note 1)

A quantum device including:

a quantum chip configured to perform information processing using a quantum state; and an interposer on which the quantum chip is mounted, wherein the quantum chip is arranged inside a recess formed in a sample stage having a cooling function, and a part of the interposer is in contact with the sample stage.

(Supplementary Note 2)

The quantum device according to Supplementary Note 1, wherein the quantum chip has a first surface mounted on the interposer and a second surface opposite to the first surface, and at least a part of the second surface is in contact with an inner surface of the recess.

(Supplementary Note 3)

The quantum device according to Supplementary Note 1, wherein the quantum chip has a first surface mounted on the interposer and a second surface opposite to the first surface, and at least a part of the second surface is bonded or joined to an inner surface of the recess.

(Supplementary Note 4)

The quantum device according to Supplementary Note 1, wherein the quantum chip has a first surface mounted on the interposer and a second surface opposite to the first surface, and the second surface is arranged via a space interposed between the second surface and an inner surface of the recess.

(Supplementary Note 5)

The quantum device according to any one of Supplementary Notes 1 to 4, wherein the recess is formed on a predetermined surface of the sample stage, and a part of a mounting surface of the interposer on which the quantum chip is mounted is in contact with the predetermined surface.

(Supplementary Note 6)

The quantum device according to Supplementary Note 5, wherein at least a part of a side surface of the interposer is in contact with a plurality of pressing members provided on the predetermined surface.

(Supplementary Note 7)

The quantum device according to Supplementary Note 6, wherein the interposer has a rectangular shape when viewed from a direction orthogonal to the mounting surface, and the plurality of pressing members presses a side surface in the vicinity of each corner portion of the interposer with a planar portion.

(Supplementary Note 8)

The quantum device according to any one of Supplementary Notes 1 to 7, wherein the interposer includes a mounting surface on which the quantum chip is mounted and an opposite surface opposite to the mounting surface, and the opposite surface is in contact with a cooling member having a cooling function.

(Supplementary Note 9)

The quantum device according to any one of Supplementary Notes 1 to 8, wherein the interposer has a mounting surface on which the quantum chip is mounted and an opposite surface opposite to the mounting surface, and the interposer includes an interposer substrate and a thermal via penetrating from the mounting surface side to the opposite surface side of the interposer substrate.

(Supplementary Note 10)

The quantum device according to Supplementary Note 9, wherein the thermal via includes a portion in which a taper having a diameter on the opposite surface side larger than a diameter on the mounting surface side is formed.

(Supplementary Note 11)

The quantum device according to Supplementary Note 9 or 10, wherein the interposer further includes a common connection member that connects a plurality of the thermal vias.

(Supplementary Note 12)

The quantum device according to any one of Supplementary Notes 1 to 11, wherein the quantum chip includes a quantum circuit in which a resonator having a loop circuit in which superconducting materials are annularly connected by a Josephson junction is formed, a depression is formed at a bottom of the recess, and when viewed from a direction orthogonal to a first surface of the quantum chip mounted on the interposer, a region where the quantum circuit is formed is included in a region of the depression.

(Supplementary Note 13)

The quantum device according to Supplementary Note 12, wherein the quantum chip is in contact with a pillar extending from the bottom of the depression in the direction orthogonal to the first surface.

(Supplementary Note 14)

The quantum device according to any one of Supplementary Notes 1 to 11, wherein the quantum chip includes a quantum circuit in which a resonator having a loop circuit in which superconducting materials are annularly connected by a Josephson junction is formed, a through hole is formed at a bottom of the recess, and when viewed from a direction orthogonal to a first surface of the quantum chip mounted on the interposer, a region where the quantum circuit is formed is included in a region of the through hole.

(Supplementary Note 15)

The quantum device according to any one of Supplementary Notes 1 to 14, wherein a side surface of the quantum chip is in contact with an inner surface of the recess.

(Supplementary Note 16)

The quantum device according to any one of Supplementary Notes 1 to 15, wherein the recess is formed on a predetermined surface of the sample stage, and at least a part of a side surface of the interposer is in contact with an inner surface of the recess.

(Supplementary Note 17)

The quantum device according to any one of Supplementary Notes 1 to 15, wherein the recess is formed on a predetermined surface of the sample stage, and a step surface having a step with respect to the predetermined surface is formed around an opening of the recess, and a part of a mounting surface of the interposer on which the quantum chip is mounted is in contact with the step surface.

(Supplementary Note 18)

The quantum device according to any one of Supplementary Notes 1 to 15, wherein the recess is formed on a predetermined surface of the sample stage, a step surface having a step with respect to the predetermined surface is formed around an opening of the recess, and at least a part of a side surface of the interposer is in contact with a side surface between the step surface and the predetermined surface.

(Supplementary Note 19)

The quantum device according to Supplementary Note 18, wherein a part of a mounting surface of the interposer on which the quantum chip is mounted is arranged via a space interposed between the mounting surface and the step surface.

(Supplementary Note 20)

The quantum device according to Supplementary Note 18, wherein a part of a mounting surface of the interposer on which the quantum chip is mounted is arranged via a spacer interposed between the mounting surface and the step surface.

REFERENCE SIGNS LIST

1, 1*a*, 1*b*, 1*c*, 1*d*, 1*e*, 1*f*, 1*g*, 1*h*, 1*i*, 1*j* QUANTUM DEVICE
2, 3, 4, 4*a* QUANTUM DEVICE
10 QUANTUM CHIP
11 FIRST SURFACE
12 SECOND SURFACE
15 CHIP SUBSTRATE
16 WIRING LAYER
17 QUANTUM CIRCUIT
17*a* JOSEPHSON JUNCTION
17*b* LOOP CIRCUIT
17*c* RESONATOR
18 REGION
20 INTERPOSER
21 MOUNTING SURFACE
22 OPPOSITE SURFACE
23 INTERPOSER WIRING LAYER
23*a* MAGNETIC FIELD APPLICATION CIRCUIT
23*b* READING UNIT
24 INTERPOSER WIRING LAYER
24*a* TERMINAL
25 INTERPOSER SUBSTRATE
26 TV
27 THERMAL VIA
28 CONNECTION MEMBER
30 SAMPLE STAGE
31 RECESS
32 PREDETERMINED SURFACE
33 PRESSING MEMBER
34 COOLING MEMBER
35 DEPRESSION
36 PILLAR
37 THROUGH HOLE
38 COUNTERBORE
39 STEP SURFACE
101 QUANTUM DEVICE
110 QUANTUM CHIP
111 FIRST SURFACE
112 SECOND SURFACE
120 INTERPOSER
121 MOUNTING SURFACE
122 OPPOSITE SURFACE
124*a* TERMINAL
130 SAMPLE STAGE
132 PREDETERMINED SURFACE
BL ADHESIVE LAYER
BP BUMP
ML METAL LAYER
SP SPACER

What is claimed is:

1. A quantum device comprising:

a quantum chip configured to perform information processing using a quantum state; and an interposer on which the quantum chip is mounted, wherein the quantum chip is arranged on a sample stage inside a recess formed in the sample stage, the sample stage having a cooling function, and the quantum chip is provided on the sample stage at a bottom of the recess, the sample stage contains a metal, and a part of the interposer is in contact with the sample stage.

2. The quantum device according to claim 1, wherein the quantum chip has a first surface mounted on the interposer and a second surface opposite to the first surface, and at least a part of the second surface is in contact with an inner surface of the recess.

3. The quantum device according to claim 1, wherein the quantum chip has a first surface mounted on the interposer and a second surface opposite to the first surface, and at least a part of the second surface is bonded or joined to an inner surface of the recess.

4. The quantum device according to claim 1, wherein the quantum chip has a first surface mounted on the interposer and a second surface opposite to the first surface, and the second surface is arranged via a space interposed between the second surface and an inner surface of the recess.

5. The quantum device according to claim 1, wherein the recess is formed on a predetermined surface of the sample stage, and a part of a mounting surface of the interposer on which the quantum chip is mounted is in contact with the predetermined surface.

6. The quantum device according to claim 5, wherein at least a part of a side surface of the interposer is in contact with a plurality of pressing members provided on the predetermined surface.

7. The quantum device according to claim 6, wherein the interposer has a rectangular shape when viewed from a direction orthogonal to the mounting surface, and the plurality of pressing members presses a side surface in the vicinity of each corner portion of the interposer with a planar portion.

8. The quantum device according to claim 1, wherein the interposer includes a mounting surface on which the quantum chip is mounted and an opposite surface opposite to the mounting surface, and the opposite surface is in contact with a cooling member having a cooling function.

9. The quantum device according to claim 1, wherein the interposer has a mounting surface on which the quantum chip is mounted and an opposite surface opposite to the mounting surface, and the interposer includes an interposer substrate and a thermal via penetrating from the mounting surface side to the opposite surface side of the interposer substrate.

10. The quantum device according to claim 9, wherein the thermal via includes a portion in which a taper having a diameter on the opposite surface side larger than a diameter on the mounting surface side is formed.

11. The quantum device according to claim 9, wherein the interposer further includes a common connection member that connects a plurality of the thermal vias.

12. The quantum device according to claim 1, wherein the quantum chip includes a quantum circuit in which a resonator having a loop circuit in which superconducting materials are annularly connected by a Josephson junction is formed, a depression is formed at a bottom of the recess, and when viewed from a direction orthogonal to a first surface of the quantum chip mounted on the interposer, a region where the quantum circuit is formed is included in a region of the depression.

13. The quantum device according to claim 12, wherein the quantum chip is in contact with a pillar extending from the bottom of the depression in the direction orthogonal to the first surface.

14. The quantum device according to claim 1, wherein the quantum chip includes a quantum circuit in which a resonator having a loop circuit in which superconducting materials are annularly connected by a Josephson junction is formed, a through hole is formed at a bottom of the recess, and when viewed from a direction orthogonal to a first surface of the quantum chip mounted on the interposer, a region where the quantum circuit is formed is included in a region of the through hole.

15. The quantum device according to claim 1, wherein a side surface of the quantum chip is in contact with an inner surface of the recess.

16. The quantum device according to claim 1, wherein the recess is formed on a predetermined surface of the sample stage, and at least a part of a side surface of the interposer is in contact with an inner surface of the recess.

17. The quantum device according to claim 1, wherein the recess is formed on a predetermined surface of the sample stage, a step surface having a step with respect to the predetermined surface is formed around an opening of the recess, and a part of a mounting surface of the interposer on which the quantum chip is mounted is in contact with the step surface.

18. The quantum device according to claim 1, wherein the recess is formed on a predetermined surface of the sample stage, a step surface having a step with respect to the predetermined surface is formed around an opening of the recess, and at least a part of a side surface of the interposer is in contact with a side surface between the step surface and the predetermined surface.

19. The quantum device according to claim 18, wherein a part of a mounting surface of the interposer on which the quantum chip is mounted is arranged via a space interposed between the mounting surface and the step surface.

20. The quantum device according to claim 18, wherein a part of a mounting surface of the interposer on which the quantum chip is mounted is arranged via a spacer interposed between the mounting surface and the step surface.

21. A quantum device comprising:

a quantum chip configured to perform information processing using a quantum state; and an interposer on which the quantum chip is mounted, wherein the quantum chip is arranged inside a recess formed in a sample stage, the sample stage having a cooling function, the recess is formed on a predetermined surface of the sample stage, a counterbore is formed around an opening of the recess, the counterbore including a step surface and being a quadrilateral, a part of a mounting surface of the interposer on which the quantum chip is mounted is in contact with the step surface, and the interposer is arranged inside the counterbore.

* * * * *